US009076655B2

(12) United States Patent
Na et al.

(10) Patent No.: US 9,076,655 B2
(45) Date of Patent: Jul. 7, 2015

(54) SEMICONDUCTOR DEVICE AND METHOD OF FORMING THROUGH-SILICON-VIA WITH SACRIFICIAL LAYER

(71) Applicant: STATS ChipPAC, Ltd., Singapore (SG)

(72) Inventors: Duk Ju Na, Singapore (SG); Calvert Tan, Singapore (SG); Chang Beom Yong, Singapore (SG)

(73) Assignee: STATS ChipPAC, Ltd., Singapore (SG)

(*) Notice: Subject to any disclaimer, the term of this patent is extended or adjusted under 35 U.S.C. 154(b) by 128 days.

(21) Appl. No.: 13/743,054

(22) Filed: Jan. 16, 2013

(65) Prior Publication Data
US 2014/0199838 A1 Jul. 17, 2014

(51) Int. Cl.
H01L 21/44 (2006.01)
H01L 21/02 (2006.01)

(52) U.S. Cl.
CPC .................. *H01L 21/02697* (2013.01)

(58) Field of Classification Search
USPC .................. 438/83–124, 411–461, 667–675; 257/730–786, E21.577, E23.067
See application file for complete search history.

(56) References Cited

U.S. PATENT DOCUMENTS

| 5,585,662 | A | * | 12/1996 | Ogawa ........................ 257/529 |
| 5,646,067 | A | | 7/1997 | Gaul |
| 6,734,084 | B1 | | 5/2004 | Nemoto et al. |
| 7,214,615 | B2 | | 5/2007 | Miyazawa |
| 7,683,458 | B2 | | 3/2010 | Akram et al. |
| 7,829,975 | B2 | | 11/2010 | Hayasaka et al. |
| 7,833,895 | B2 | | 11/2010 | Bonifield et al. |
| 8,026,592 | B2 | | 9/2011 | Yoon et al. |
| 2005/0075056 | A1 | * | 4/2005 | Wu et al. ........................ 451/57 |
| 2007/0020918 | A1 | * | 1/2007 | Hirokawa et al. ............. 438/626 |
| 2011/0133333 | A1 | * | 6/2011 | Kwon et al. ................... 257/737 |
| 2013/0147055 | A1 | | 6/2013 | Na et al. |

* cited by examiner

Primary Examiner — Charles Garber
Assistant Examiner — Abdulfattah Mustapha
(74) Attorney, Agent, or Firm — Robert D. Atkins; Patent Law Group: Atkins and Associates, P.C.

(57) ABSTRACT

A semiconductor device can be formed by first providing a semiconductor wafer, and forming a conductive via into the semiconductor wafer. A portion of the semiconductor wafer can be removed so that the conductive via extends above a surface of the semiconductor wafer. A first insulating layer can be formed over the surface of the semiconductor wafer and the conductive via, followed by a second insulating layer, the second insulating layer having a different material composition than the first insulating layer. Portions of the insulating layers can be removed to expose the conductive via.

22 Claims, 12 Drawing Sheets

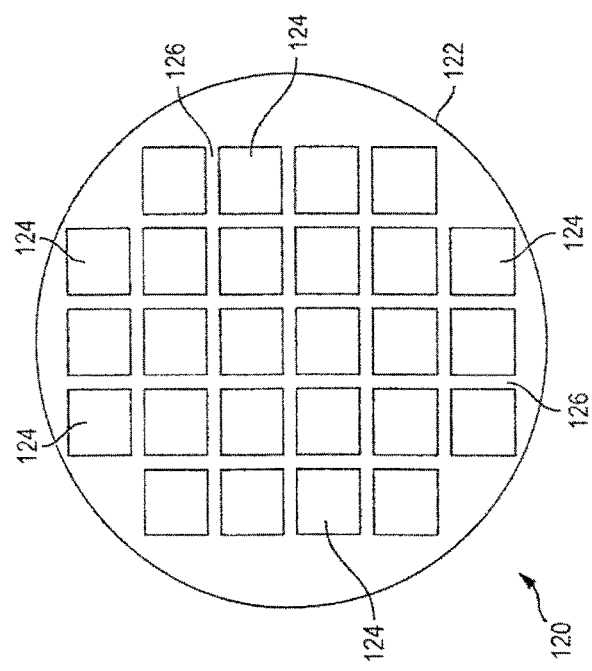
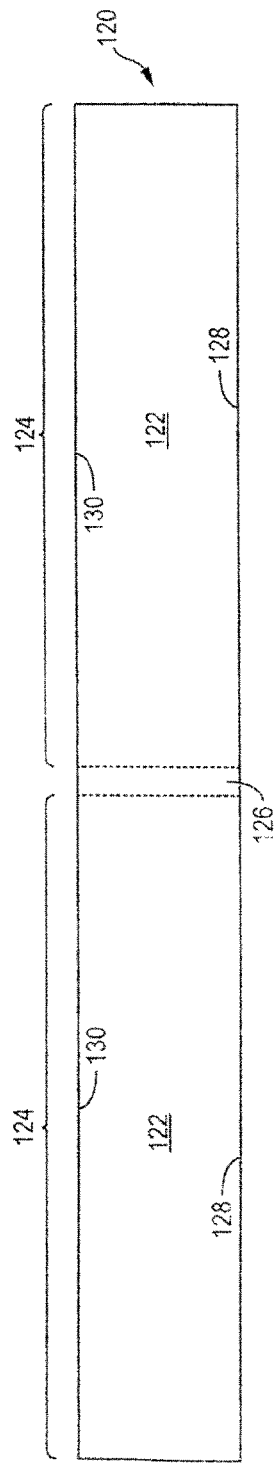

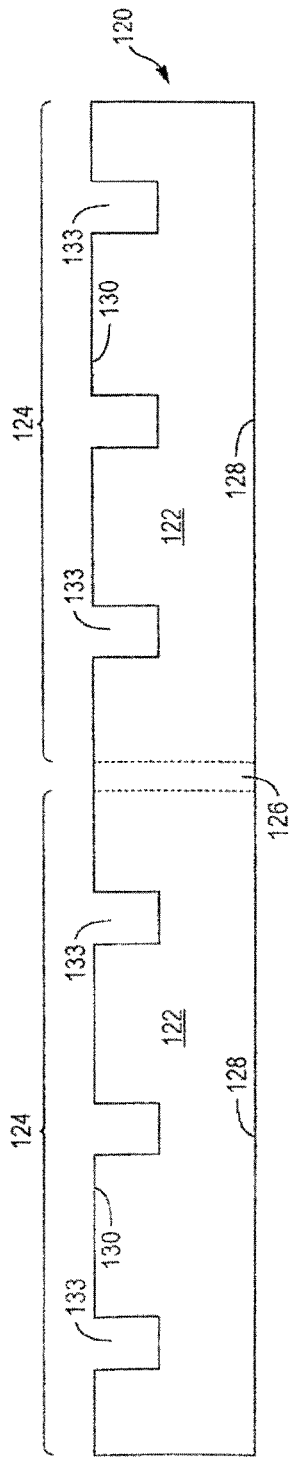
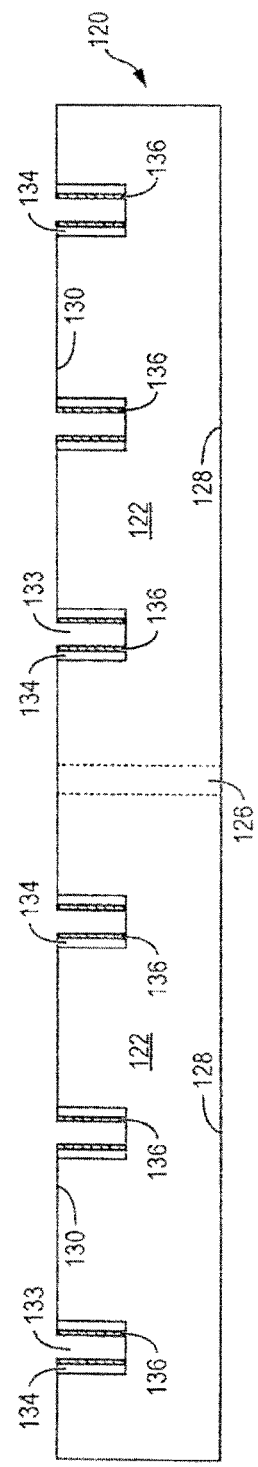
FIG. 3c
FIG. 3d

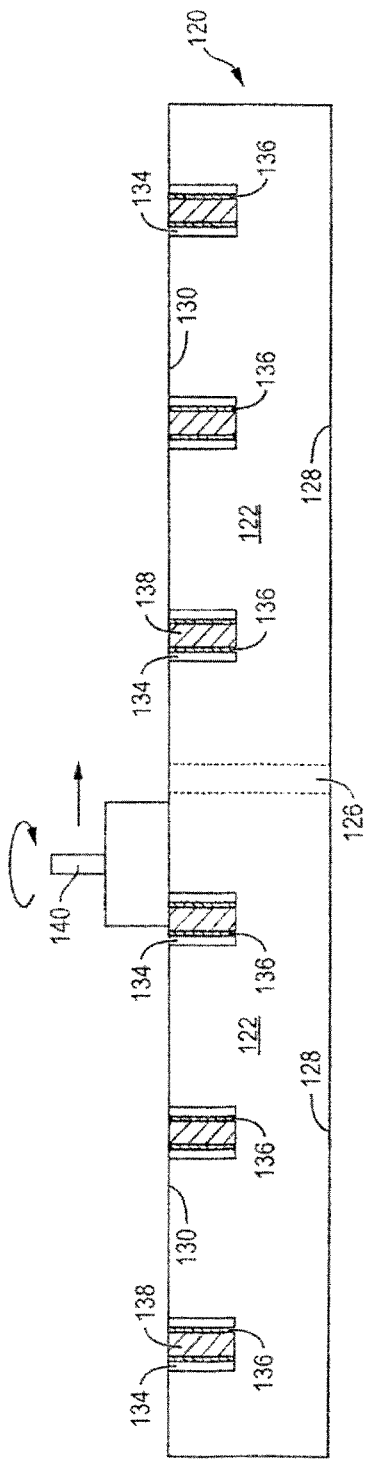
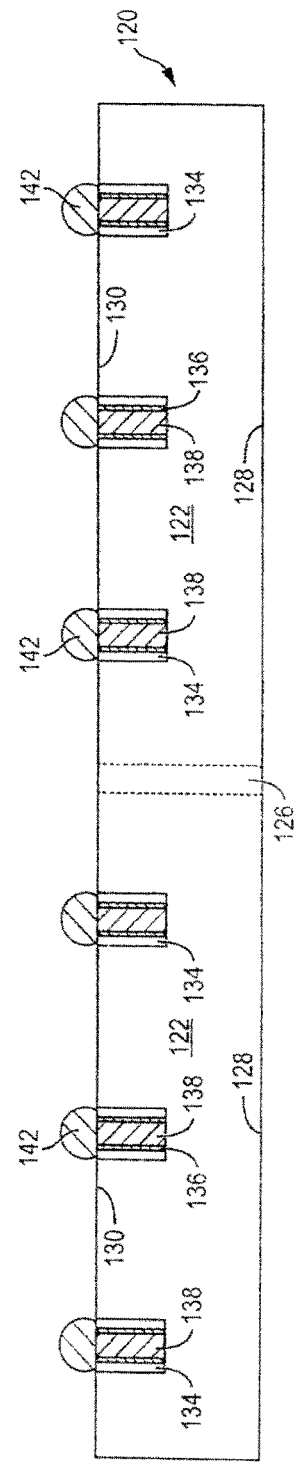
FIG. 3e
FIG. 3f

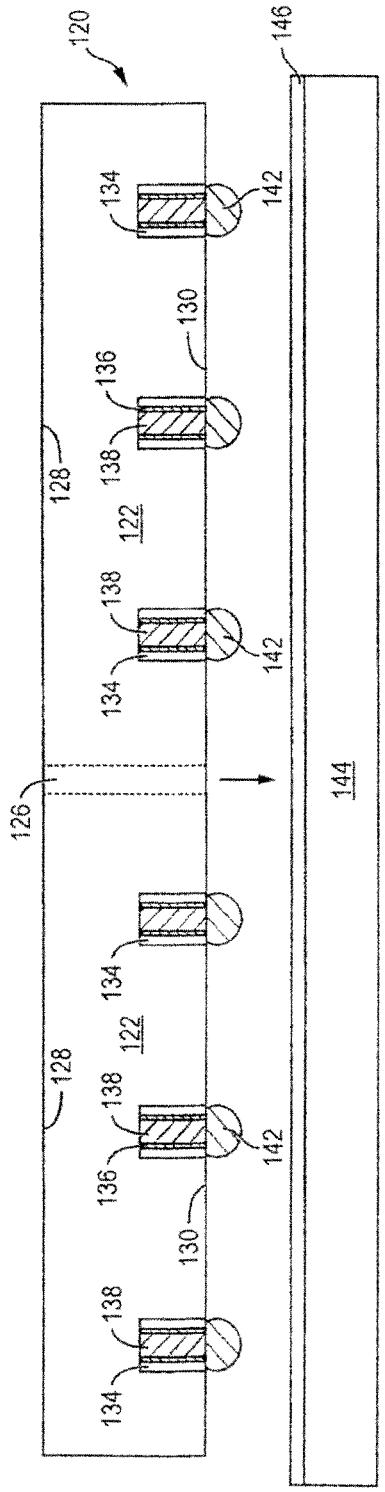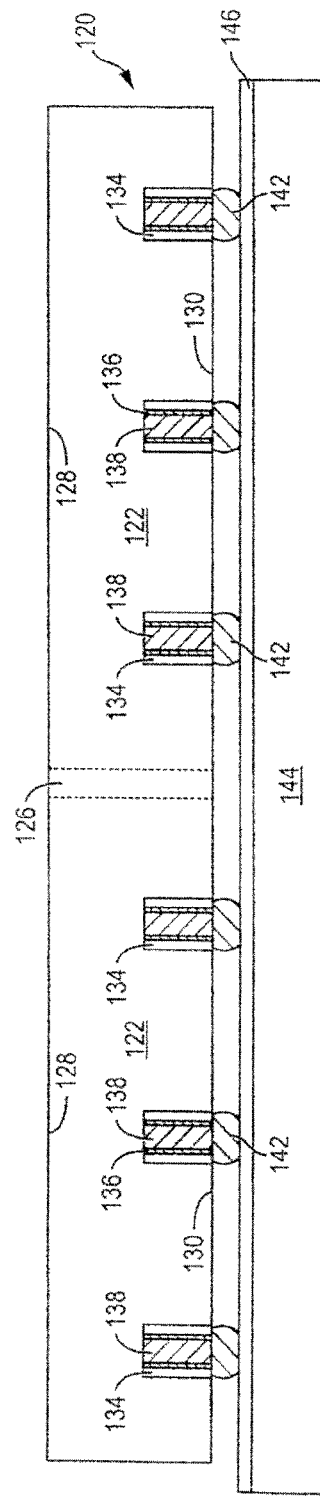

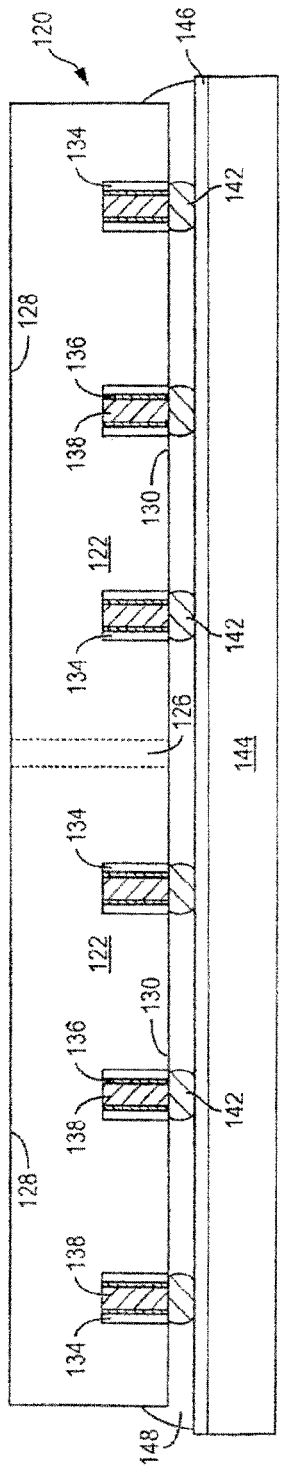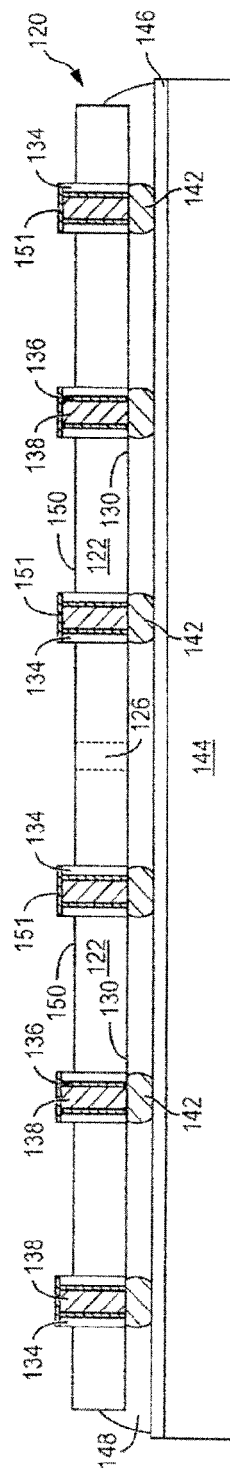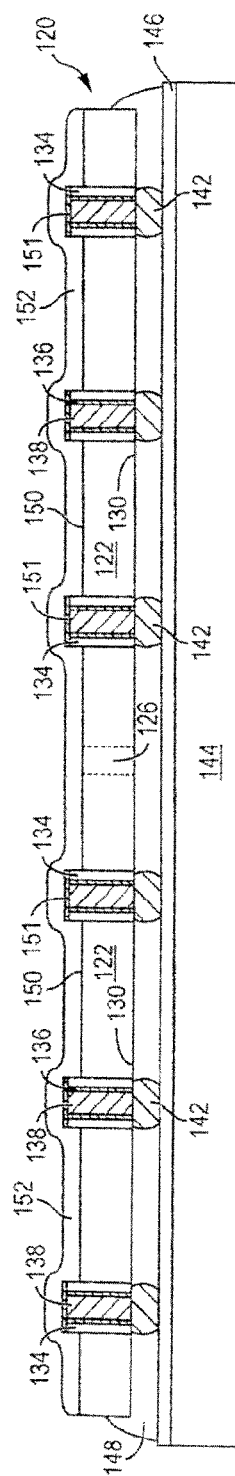

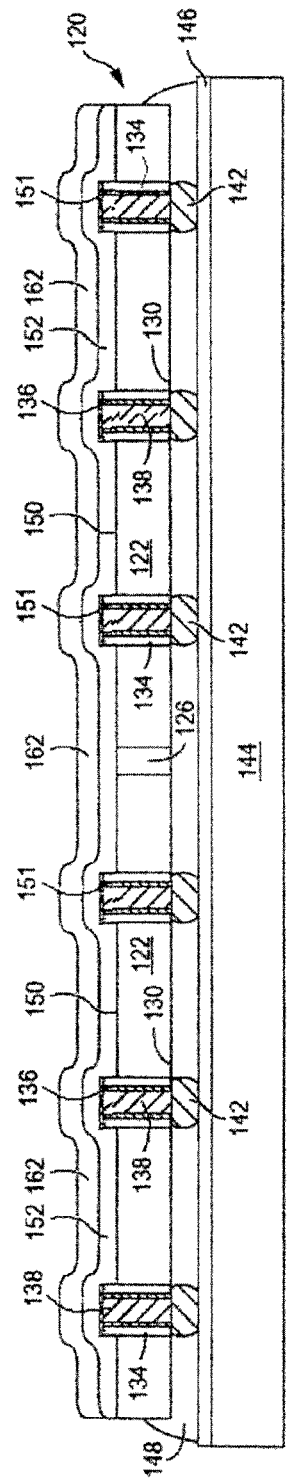
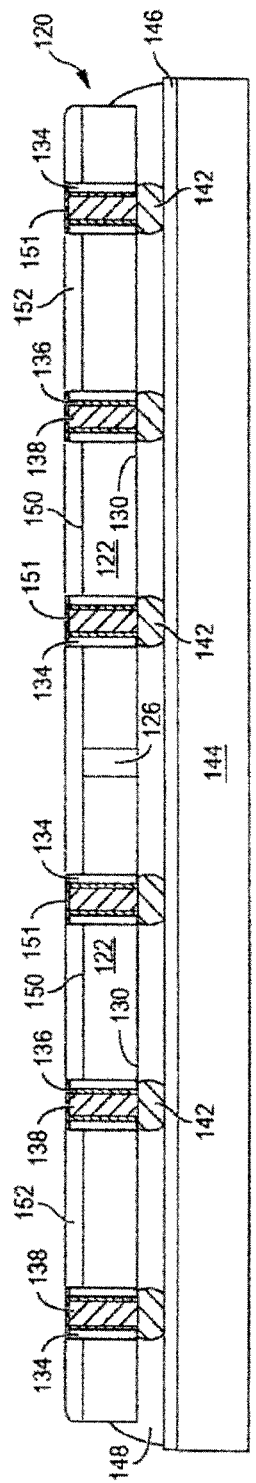
FIG. 3l
FIG. 3m

SEMICONDUCTOR DEVICE AND METHOD OF FORMING THROUGH-SILICON-VIA WITH SACRIFICIAL LAYER

TECHNICAL FIELD

The present disclosure relates in general to semiconductor devices and, more particularly, to a semiconductor device and method of forming TSV with sacrificial material.

BACKGROUND

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density active and passive components. Back-end processes may result in semiconductor device packages with a smaller footprint by improvements in electrical interconnection and packaging materials.

A conventional semiconductor wafer may contain conductive through silicon vias (TSV). A plurality of vias is formed through the semiconductor wafer. The vias are filled with conductive material to form the conductive TSV. A portion of the back surface of the semiconductor wafer is removed by chemical mechanical polishing (CMP) to expose a portion of the side surface of the conductive TSV. CMP is an expensive manufacturing process. Alternatively, a portion of the back surface of the semiconductor wafer is removed by a photolithographic etching process with a $1x$ stepper to expose a portion of the side surface of the conductive TSV. The $1x$ stepper typically cannot provide sufficient overlay margin for the photolithographic and etching process.

SUMMARY

System and methods of forming TSV in semiconductor devices using sacrificial materials are disclosed. In one embodiment, a method includes: (a) providing a semiconductor wafer; (b) forming a conductive via into the semiconductor wafer; (c) removing a portion of the semiconductor wafer so the conductive via extends above a surface of the semiconductor wafer; (d) forming a first insulating layer over the surface of the semiconductor wafer and the conductive via; (e) forming a second insulating layer over the first insulating layer, the second insulating layer having a different material composition than the first insulating layer; and (f) removing a portion of the second insulating layer and a portion of the first insulating layer to expose the conductive via.

In one embodiment, the forming step (e) includes conformally forming the second insulating layer over the first insulating layer. In another embodiment, the forming step (e) includes non-conformally forming the second insulating layer over the first insulating layer. In one embodiment, the removing step (f) includes complete removal of the second insulating layer.

In one embodiment, the first insulating layer includes silicon nitride and the second insulating layer includes at least one of silicon oxide, silicon dioxide, silicon oxynitride and silicon carbon nitride. In another embodiment, the first insulating layer includes at least one of silicon oxide and silicon dioxide, and the second insulating layer includes at least one of silicon nitride, silicon oxynitride and silicon carbon nitride. In some embodiments, the thickness of the second insulating layer is in the range of from about 0.5 micron to about 5 microns.

In one embodiment, a method of forming TSV in semiconductor devices using sacrificial materials includes: (a) providing a semiconductor wafer; (b) forming a conductive via into the semiconductor wafer with a portion of the conductive via extending above a surface of the semiconductor wafer; (c) forming a plurality of insulating layers over the surface of the semiconductor wafer and the conductive via; and (d) removing a portion of the plurality of insulating layers to expose the conductive via.

In one embodiment, the forming step (c) includes: forming a first insulating layer over the surface of the semiconductor wafer and the conductive via; and forming a second insulating layer over the first insulating layer, the second insulating layer having a different material composition than the first insulating layer.

In another embodiment, the removing step (d) includes: removing a portion of the second insulating layer; and removing a portion of the first insulating layer, the two removing steps capable of exposing the conductive via.

In one embodiment, the first insulating layer includes silicon nitride and the second insulating layer includes at least one of silicon oxide, silicon dioxide, silicon oxynitride and silicon carbon nitride. In another embodiment, the first insulating layer includes at least one of silicon oxide and silicon dioxide, and the second insulating layer includes at least one of silicon nitride, silicon oxynitride and silicon carbon nitride. In some embodiments, the thickness of the second insulating layer is in the range of from about 0.5 micron to about 5 microns.

In one embodiment, the second insulating layer is conformally formed over the first insulating layer. In another embodiment, the second insulating layer is non-conformally formed over the first insulating layer.

In one embodiment, a method of forming TSV in semiconductor devices using sacrificial materials includes: (a) providing a semiconductor wafer; (b) forming a conductive via into the semiconductor wafer; (c) removing a portion of the semiconductor wafer so the conductive via extends above a surface of the semiconductor wafer; (d) forming a first insulating layer over the surface of the semiconductor wafer and the conductive via, the first insulating layer being silicon nitride; (e) forming a second insulating layer over the first insulating layer, the second insulating layer being at least one of silicon oxide, silicon dioxide, silicon oxynitride and silicon carbon nitride; and (f) removing a portion of the second insulating layer and a portion of the first insulating layer to expose the conductive via.

In one embodiment, the forming step (e) includes conformally forming the second insulating layer over the first insulating layer. In another embodiment, the forming step (e) includes non-conformally forming the second insulating layer over the first insulating layer. In yet another embodiment, the removing step (f) includes complete removal of the second insulating layer. In some embodiments, the thickness of the second insulating layer is in the range of from about 0.5 micron to about 5 microns.

Other variations, embodiments and features of the present disclosure will become evident from the following detailed description, drawings and claims.

BRIEF DESCRIPTION OF THE DRAWINGS

FIGS. 3a-3m illustrate a process of forming TSV with sacrificial layer.

DETAILED DESCRIPTION OF THE DISCLOSURE

Figure 1:
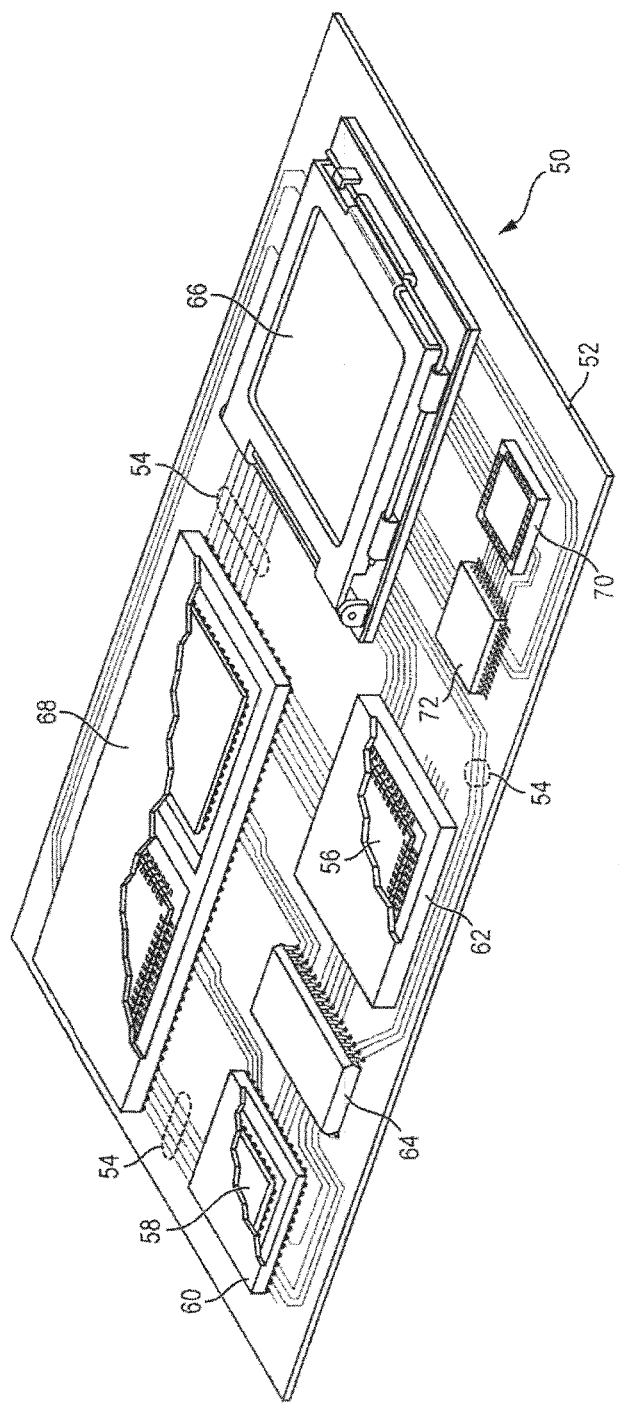
FIG. 1 illustrates a printed circuit board (PCB) with different types of packages mounted to its surface.

It will be appreciated by those of ordinary skill in the art that the embodiments disclosed herein can be embodied in other specific forms without departing from the spirit or essential character thereof. The presently disclosed embodiments are therefore considered in all respects to be illustrative and not restrictive.

The present disclosure is described in one or more embodiments in the following description with reference to the figures, in which like numerals represent the same or similar elements. While the disclosure is described in terms of the best mode for achieving the disclosure's objectives, it will be appreciated by those skilled in the art that it is intended to cover alternatives, modifications, and equivalents as may be included within the spirit and scope of the disclosure as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition can involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. In one embodiment, the portion of the photoresist pattern subjected to light is removed using a solvent, exposing portions of the underlying layer to be patterned. In another embodiment, the portion of the photoresist pattern not subjected to light, i.e., the negative photoresist, is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Patterning is the basic operation by which portions of the top layers on the semiconductor wafer surface are removed. Portions of the semiconductor wafer can be removed using photolithography, photomasking, masking, oxide or metal removal, photography and stenciling, and microlithography. Photolithography includes forming a pattern in reticles or a photomask and transferring the pattern into the surface layers of the semiconductor wafer. Photolithography forms the horizontal dimensions of active and passive components on the surface of the semiconductor wafer in a two-step process. First, the pattern on the reticle or masks is transferred into a layer of photoresist. Photoresist is a light-sensitive material that undergoes changes in structure and properties when exposed to light. The process of changing the structure and properties of the photoresist occurs as either negative-acting photoresist or positive-acting photoresist. Second, the photoresist layer is transferred into the wafer surface. The transfer occurs when etching removes the portion of the top layers of semiconductor wafer not covered by the photoresist. The chemistry of photoresists is such that the photoresist remains substantially intact and resists removal by chemical etching solutions while the portion of the top layers of the semiconductor wafer not covered by the photoresist is removed. The process of forming, exposing, and removing the photoresist, as well as the process of removing a portion of the semiconductor wafer can be modified according to the particular resist used and the desired results.

In negative-acting photoresists, photoresist is exposed to light and is changed from a soluble condition to an insoluble condition in a process known as polymerization. In polymerization, unpolymerized material is exposed to a light or energy source and polymers form a cross-linked material that is etch-resistant. In most negative resists, the polymers are polyisopremes. Removing the soluble portions (i.e. the portions not exposed to light) with chemical solvents or developers leaves a hole in the resist layer that corresponds to the opaque pattern on the reticle. A mask whose pattern exists in the opaque regions is called a clear-field mask.

In positive-acting photoresists, photoresist is exposed to light and is changed from relatively nonsoluble condition to much more soluble condition in a process known as photo-solubilization. In photosolubilization, the relatively insoluble resist is exposed to the proper light energy and is converted to a more soluble state. The photosolubilized part of the resist can be removed by a solvent in the development process. The basic positive photoresist polymer is the phenol-formaldehyde polymer, also called the phenol-formaldehyde novolak resin. Removing the soluble portions (i.e. the portions exposed to light) with chemical solvents or developers leaves a hole in the resist layer that corresponds to the transparent pattern on the reticle. A mask whose pattern exists in the transparent regions is called a dark-field mask.

After removal of the top portion of the semiconductor wafer not covered by the photoresist, the remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual semiconductor die and then packaging the semiconductor die for structural support and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 can have one type of semiconductor package, or multiple types of semiconductor packages, depending on the application. The different types of semiconductor packages are shown in FIG. 1 for purposes of illustration.

Electronic device 50 can be a stand-alone system that uses the semiconductor packages to perform one or more electrical functions. Alternatively, electronic device 50 can be a sub-component of a larger system. For example, electronic device 50 can be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. Miniaturization and weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including bond wire package 56 and flipchip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

Figure 2A:
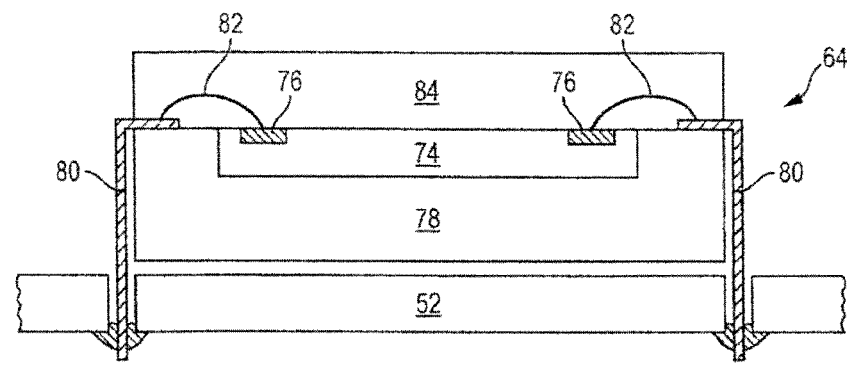
FIGS. 2a-2c illustrate further detail of the representative semiconductor packages mounted to the PCB.
Figure 2B:
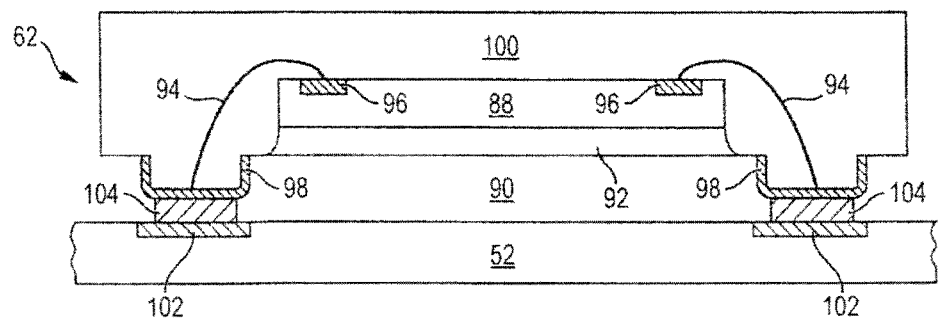
Figure 2C:
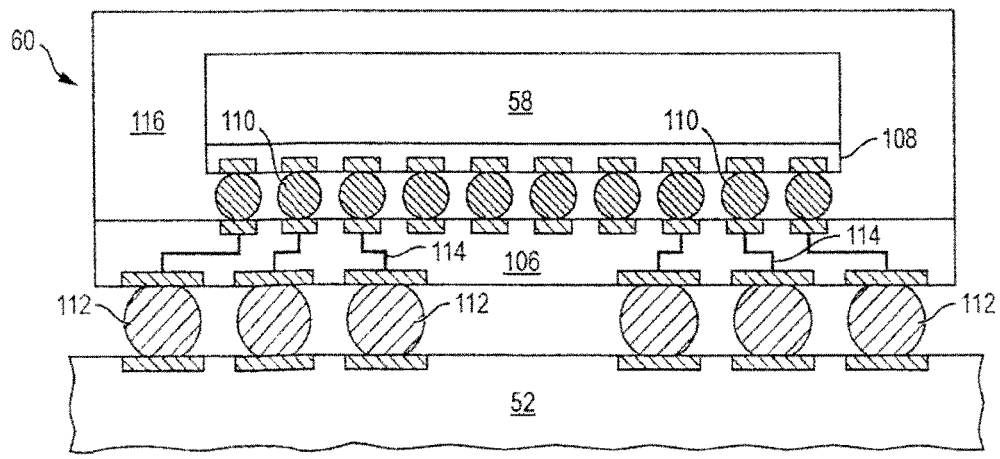

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit can include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and bond wires 82 provide electrical interconnect between semiconductor die 74 and PCB 52. Encapsulant 84 is deposited over the package for environmental protection by preventing moisture and particles from entering the package and contaminating semiconductor die 74 or bond wires 82.

FIG. 2b illustrates further detail of BCC 62 mounted on PCB 52. Semiconductor die 88 is mounted over carrier 90 using an underfill or epoxy-resin adhesive material 92. Bond wires 94 provide first level packaging interconnect between contact pads 96 and 98. Molding compound or encapsulant 100 is deposited over semiconductor die 88 and bond wires 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flipchip style first level packaging. Active region 108 of semiconductor die 58 contains analog or digital circuits implemented as active devices, passive devices, conductive layers, and dielectric layers formed according to the electrical design of the die. For example, the circuit can include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flipchip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flipchip style first level packaging without intermediate carrier 106.

FIGS. 3a-3m illustrate, in relation to FIGS. 1 and 2a-2c, a process of forming conductive TSV through a semiconductor wafer using sacrificial layer, end point detection (EPD), and chemical mechanical polishing (CMP) process. FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by a non-active, inter-die wafer area or saw street 126 as described above. Saw street 126 provides cutting areas to singulate semiconductor wafer 120 into individual semiconductor die 124.

FIG. 3b shows a cross-sectional view of a portion of semiconductor wafer 120. Each semiconductor die 124 has a back surface 128 and active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

In FIG. 3c, a plurality of blind vias 133 is formed into active surface 130 and partially but not completely through semiconductor wafer 120 using mechanical drilling, laser drilling, or deep reactive ion etching (DRIE).

In FIG. 3d, an insulating or dielectric layer 134 is formed over sidewalls of vias 133 using PVD, CVD, printing, spin coating, spray coating, sintering or thermal oxidation. The insulating layer 134 contains one or more layers of silicon dioxide (SiO2), silicon nitride (Si3N4), silicon oxynitride (SiON), tantalum pentoxide (Ta2O5), aluminum oxide (Al2O3), hafnium oxide (HfO2), benzocyclobutene (BCB), polyimide (PI), polybenzoxazoles (PBO), or other suitable dielectric material.

An electrically conductive layer 136 is formed over insulating layer 134 within vias 133 using a patterning and metal deposition process such as printing, PVD, CVD, sputtering, electrolytic plating, and electroless plating. Conductive layer 136 can be one or more layers of Ni, tantalum nitride (TaN), nickel vanadium (NiV), platinum (Pt), palladium (Pd), chromium copper (CrCu), or other suitable barrier material.

In FIG. 3e, blind vias 133 are filled with Al, Cu, Sn, Ni, Au, Ag, titanium (Ti), tungsten (W), poly-silicon, or other suitable electrically conductive material using electrolytic plating, electroless plating process, or other suitable metal deposition process to form z-direction conductive TSV 138 lined with insulating layer 134 and conductive layer 136 and embedded within semiconductor wafer 120. In one embodiment, conductive layer 136 operates as a barrier layer to inhibit diffusion of conductive TSV 138, e.g. Cu, into insulating layer 134 and base substrate material 122. Conductive TSV 138 are electrically connected to the circuits on active surface 130. A portion of active surface 130 of semiconductor die 124 is optionally removed by grinder 140 or CMP to planarize the surface and expose conductive TSV 138.

In FIG. 3f, an electrically conductive bump material is deposited over conductive TSV 138 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to conductive TSV 138 using a suitable attachment or bonding process. In one embodiment, the bump material is reflowed by heating the material above its melting point to form spherical balls or bumps 142. In some applications, bumps 142 are reflowed a second time to improve electrical contact to conductive TSV 138. An optional under bump metallization (UBM) layer can be disposed between bumps 142 and conductive TSV 138. Bumps 142 can also be compression bonded to conductive TSV 138. Bumps 142 represent one type of interconnect structure that can be formed over conductive TSV 138. The interconnect structure can also use stud bump, micro bump, or other electrical interconnect.

FIG. 3g shows a temporary substrate or carrier 144 containing sacrificial base material such as silicon, polymer, beryllium oxide, glass, or other suitable low-cost, rigid material for structural support. An interface layer or double-sided tape 146 is formed over carrier 144 as a temporary adhesive bonding film, etch-stop layer, or thermal release layer. Semiconductor wafer 120 is inverted, positioned over, and mounted to interface layer 146 over carrier 144 with active surface 130 and bumps 142 oriented toward the carrier. FIG. 3h shows semiconductor wafer 120 mounted to interface layer 146 over carrier 144.

Semiconductor wafer 120 and carrier 144 are placed in a chase mold. A mold underfill (MUF) material 148 in a liquid state is injected into the chase mold between semiconductor wafer 120 and carrier 144. MUF material 148 can be an encapsulant, molding compound, or polymer composite material, such as epoxy resin with filler, epoxy acrylate with filler, or polymer with proper filler. MUF material 148 is cured. FIG. 3i shows MUF material 148 disposed between semiconductor wafer 120 and carrier 144.

In FIG. 3j, a portion of back surface 128 is removed by a combination of backgrinding, CMP, and/or etching processes to expose conductive TSV 138 above surface 150 of semiconductor wafer 120. Conductive TSV 138 remains lined with insulating layer 134 and conductive layer 136 and extending above surface 150 of semiconductor wafer 120.

An electrically conductive layer 151 is formed over insulating layer 134, conductive layer 136, and conductive TSV 138 using a patterning and metal deposition process such as printing, PVD, CVD, sputtering, electrolytic plating, and electroless plating. Conductive layer 151 can be one or more layers of titanium tungsten (TiW), titanium copper (TiCu), titanium tungsten copper (TiWCu), tantalum nitrogen copper (TaNCu), or other suitable material. In one embodiment, conductive layer 151 operates as a seed layer for electrical interconnect to external devices. Conductive layer 151 can be formed prior to etching surface 128 to extend conductive TSV 138 above surface 150.

In FIG. 3k, an insulating or dielectric layer 152 is conformally applied over surface 150 of semiconductor wafer 120, insulating layer 134, and conductive layer 151 using PVD, CVD, printing, spin coating, spray coating, sintering or thermal oxidation. The insulating layer 152 contains one or more layers of SiO2, Si3N4, SiON, Ta2O5, Al2O3, HfO2, PI, BCB, PBO, or other material having similar dielectric properties. The insulating layer 152 follows the contour of surface 150, insulating layer 134, and conductive layer 151.

In FIG. 3l, another insulating layer 162 can be conformally applied over the previous insulating or dielectric layer 152. In another embodiment, the insulating layer 162 can also be non-conformally applied over the insulating or dielectric layer 152. The insulating layer 162 can be formed using the same material and in the same manner as that of the insulating or dielectric layer 152. In addition to covering the dielectric layer 152, the insulating layer 162 can also cover the surface 150 of the semiconductor wafer 120, insulating layer 134, and conductive layer 151. In some instances, the insulating layer 162 can follow the contour of the dielectric layer 152, the surface 150 of the semiconductor wafer 120, the insulating layer 134, and the conductive layer 151.

In FIG. 3m, portions of the dielectric layer 152 as well as the insulating layer 162 can be removed via a chemical mechanical polishing (CMP) process similar to that described above. In these instances, the CMP process can remove portions of the insulating layer 162, the entire insulating layer 162, portions of the dielectric layer 152, or combinations or variations thereof. Because both the dielectric layer 152 and the insulating layer 162 are shielding or passivation layers, they need not be completely removed. In operation, CMP is able to planarize the contoured or convoluted surface and expose the conductive TSV 138 by removing, chemically and mechanically, portions of the two layers 152, 162. In other embodiments, other etching or removal processes may be incorporated. The planarization and removal of the contoured layers 152, 162 subsequently allows additional processing steps to be carried out to the conductive TSV 138 and the rest of the semiconductor wafer 120, including without limitation additional stacking of interconnects or integrating additional semiconductor devices (not shown).

FIGS. 4a-4d is a process flow of forming a conductive TSV using a sacrificial layer according to another embodiment of the present disclosure. TSV technology can offer high connectivity and low parasitic between semiconductor devices via 3D integration, as the demand for higher performance, small size, and higher density of electronic devices continue to drive the development of such integration where different functional devices are merged into a single package. One of the challenges of TSV processing is to reveal the conductive via (e.g., copper via) at post TSV process and chemical mechanical polishing (CMP) is one of the removal processes for doing so. Challenges with CMP include the difficulty of detecting end point (e.g., when to stop etching or polishing) when there is little discerning difference in the passivation layers/materials. Under-polishing can render unopen TSV and uneven TSV surface, while over-polishing can cause too little passivation layer to remain resulting in leakage issues.

In one embodiment, the present disclosure provides a method of providing clear EPD for CMP by adding a sacrificial layer that is able to deliver signal differences during CMP. The processing steps as shown in FIGS. 4a-4d is one example of a package that is ready for backside grinding and CMP processes.

Figure 4A:
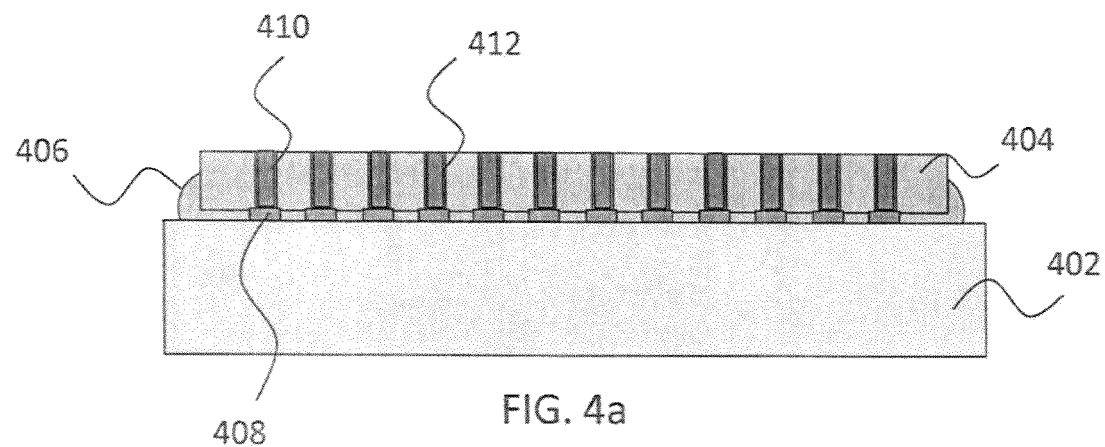
FIGS. 4a-4d illustrate a process flow of forming TSV with sacrificial layer according to another embodiment.

A method of making the semiconductor device starts by providing a semiconductor wafer 404 as shown in FIG. 4a. The semiconductor wafer 404 can be a silicon wafer coupled to a carrier 402 using an underfill material 406 similar to the process described above. A plurality of TSV or conductive vias 410 (e.g., copper vias) can be formed into the semiconductor wafer 404, each conductive via 410 having a corresponding conductive bump 408 (e.g., solder or copper bump). An insulating layer 412 such as liner oxide can be formed about each conductive via 410. As can be appreciated by one skilled in the art, all of these steps can be carried out using processes and technologies described above, the components having the same or similar material properties.

Figure 4B:
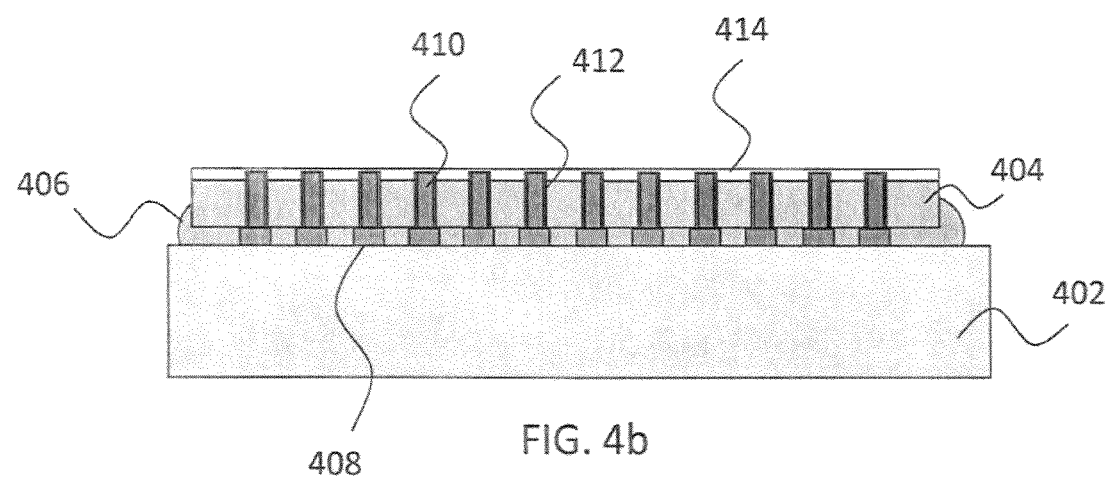

FIG. 4b shows the package of FIG. 4a with a portion of the semiconductor wafer 404 removed so the conductive vias 410 extends above a surface of the semiconductor wafer 404 (e.g., protruding copper vias). Removal of portions of the semiconductor wafer 404 can be accomplished by suitable silicon etching processes as understood by one skilled in the art. A first dielectric or insulating layer 414 can be formed over the surface of the semiconductor wafer 404 and the conductive vias 410, the dielectric or insulating layer 414 being formed via suitable coating or deposition processes, among others. In this instance, the dielectric or first insulating layer 414 is able to completely cover the conductive vias 410 and any portion that extends above the surface of the semiconductor wafer 404. Similarly, the dielectric or first insulating layer 414 is able to completely cover the surface of the semiconductor wafer 404.

Figure 4C:
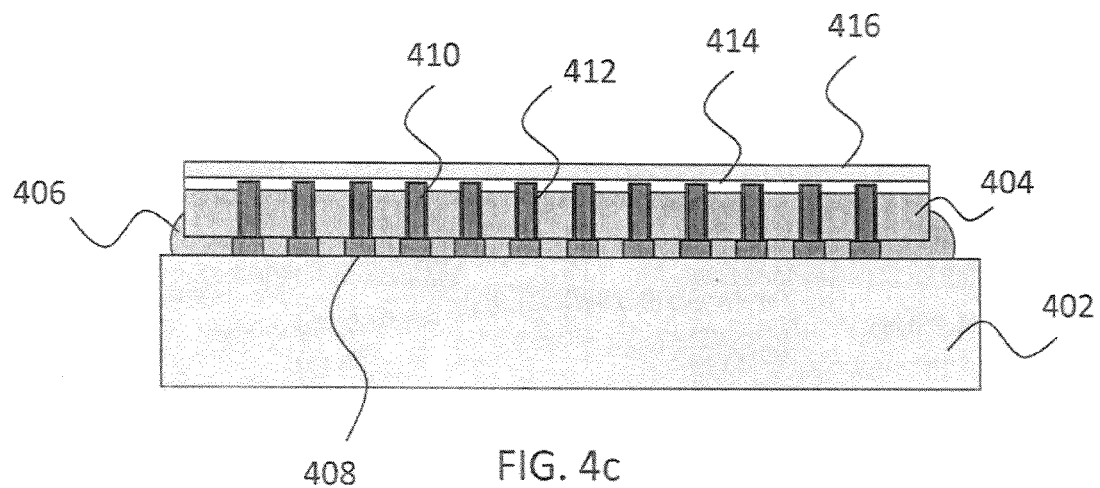

FIG. 4c shows the package of FIG. 4b with a second dielectric or insulating layer 416 being formed over the first dielectric or insulating layer 414, the second dielectric or insulating layer 416 having a different material composition than the first dielectric or insulating layer 414. In one embodiment, the thickness of the second dielectric or insulating layer 416 can be in the range of from about 0.5 micron to about 5 microns. In some embodiments, the thickness of the second dielectric or insulating layer 416 can be less than 0.5 micron or greater than 5 microns. In other embodiments, the thickness of the second dielectric or insulating layer 416 can be about 1 micron, or about 1.5 microns, or about 2 microns, or about 2.5 microns, or about 3 microns, or about 3.5 microns, or about 4 microns, or about 4.5 microns.

The thickness of the second dielectric or insulating layer 416 can be modified as necessary depending on the amount of protrusion of the conductive vias 410. For example, the second dielectric or insulating layer 416 can be greater than 5 microns if the amount of protrusion of the conductive vias 410 is large, while little to minimal protrusion of the conductive vias 410 may mean that the second dielectric or insulating layer 416 can be 0.5 micron or less. The greater the amount of protrusion the better process margin there can be for this backside via or conductive via 410 removal process. The addition of the second insulating layer 416 also means that higher protruding conductive vias 410 can be supported with reduced breakage concerns.

In one embodiment, the second insulating layer 416 can be conformally formed over the first insulating layer 414. Conformal coating can be defined as coverage that conforms to virtually any shape including crevices, points, sharp edges, and flat, exposed surfaces. In another embodiment, the second insulating layer 416 need not be conformally formed over the first insulating layer 414. Examples of the different types of coverage or coating will be better illustrated in subsequent figures.

Figure 4D:
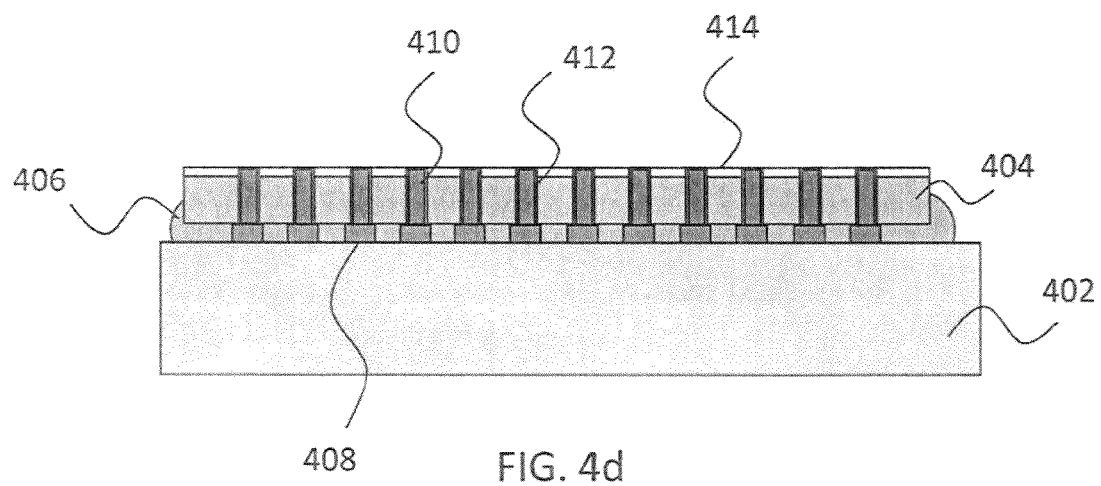

FIG. 4d shows the package of FIG. 4c where portions of the second insulating layer 416 as well as portions of the first insulating layer 414 have been removed to expose the conductive vias 410. In this embodiment, the removal step includes the complete removal of the second insulating layer 416. Similar to above, the removal step can be accomplished via a CMP process. In operation, the second insulating layer 416 is similar to that of a sacrificial layer where this layer and its material composition is sacrificed to facilitate EPD of the CMP process. The CMP process is able to planarize or remove any amount of protrusion of the conductive vias 410 such that the upper surface of the package is substantially planar or flat across the entire width of the semiconductor wafer 404.

In one embodiment, the first insulating layer 414 includes silicon nitride while the second insulating layer 416 includes at least one of silicon oxide, silicon dioxide, silicon oxynitride and silicon carbon nitride. In an alternative embodiment, the first insulating layer 414 includes at least one of silicon oxide and silicon dioxide, while the second insulating layer 416 includes at least one of silicon nitride, silicon oxynitride and silicon carbon nitride.

CMP end point detection (EPD) techniques can be via optical detection or motor current (e.g. torque) detection, or combination of both. For optical detection, laser or monochromatic light intensity or reflectance changes when different material is emitted. For example, silicon oxide may have one reflectance value while silicon nitride many have another reflectance value. Different dielectric or insulating materials would have different values. In the alternative, optical detection may utilize multi-wavelength white spectrum light, which changes according to layer thickness. For motor current detection, the current of the motor can change due to the motor load as the CMP process encounters a different material. In other words, different materials (e.g., silicon oxide, silicon nitride) may polish at different rates and require different amount of current depending on the motor load. It will be appreciated by one skilled in the art that other end point detection (EPD) methods for CMP process may be utilized in combination with the current disclosure.

In general, the idea is that different materials have different optical properties and can be chemically and/or mechanically polished at different rates (e.g., different motor speed, current due to material properties). The combination of the two dielectric or insulating layers 414, 416, allows for the change in optical and/or material properties to be detected by CMP EPD techniques. In doing so, it allows for better and more accurate process control. In short, the two dielectric or insulating layers 414, 416 should have different material properties. For example, if the second insulating layer 416 (e.g., sacrificial layer) is oxide, then the first insulating layer 414 (e.g., passivation layer) should be nitride, or vice versa. The distinctive material changes (e.g., going from oxide to nitride or vice versa) with a CMP process as the insulating layers 414, 416 are slowly removed allow for improved end point detection (EPD) and facilitate the protrusion removal process. In other words, the upper insulating layer 416 can function as a sacrificial layer, while the lower insulating layer 414 can function as an etch stop layer. The CMP EPD process can recognize the change in material and realize that portions of the wafer have been removed and that most of the upper layer is gone and the machine has now reached the lower layer. The resulting wafer is one that can be substantially planar and ready for subsequent processing steps.

Figure 5A:
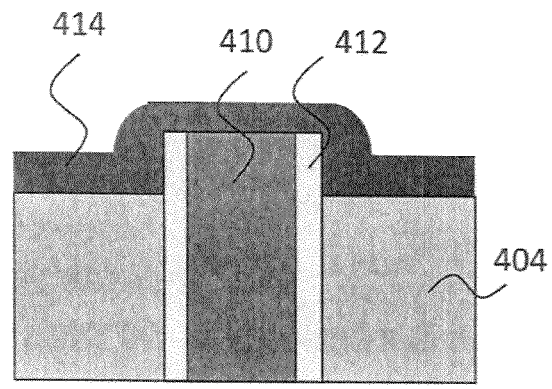
FIGS. 5a-5c illustrate cross-sectional views of the packages in FIGS. 4b-4d.
Figure 5B:
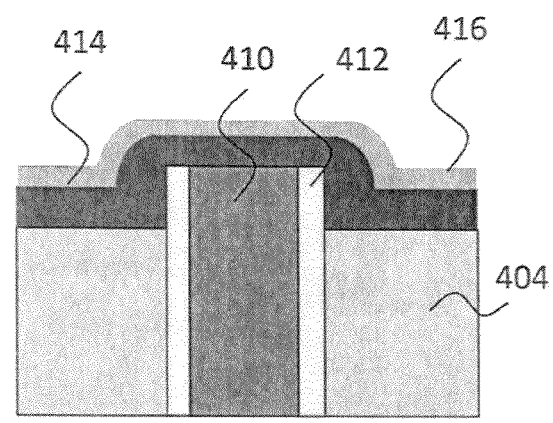
Figure 5C:
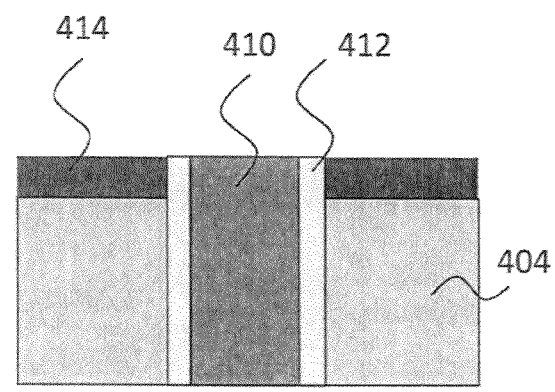

FIGS. 5a-5c are cross-sectional views of the packages in FIGS. 4b-4d. In FIG. 5a, conformal coverage of the first insulating layer 414 can be formed over and around the conductive via 410, the liner oxide 412, as well as the surface of the semiconductor wafer 404. In FIG. 5b, the second insulating layer 416 is applied over the first insulating layer 414. In this example, the second insulating layer 416 is conformally covering the first insulating layer 414. The second insulating layer 416 is also conformally covering the conductive via 410, the liner oxide 412, as well as the surface of the semiconductor wafer 404. In FIG. 5c, the second insulating layer 416 has been completed removed by the CMP process as well as portions of the first insulating layer 414 leaving a substantially planar upper surface of the conductive via 410 surrounded by liner oxide 412 on the semiconductor wafer 404 passivated with the first insulating layer 414.

Figure 6A:
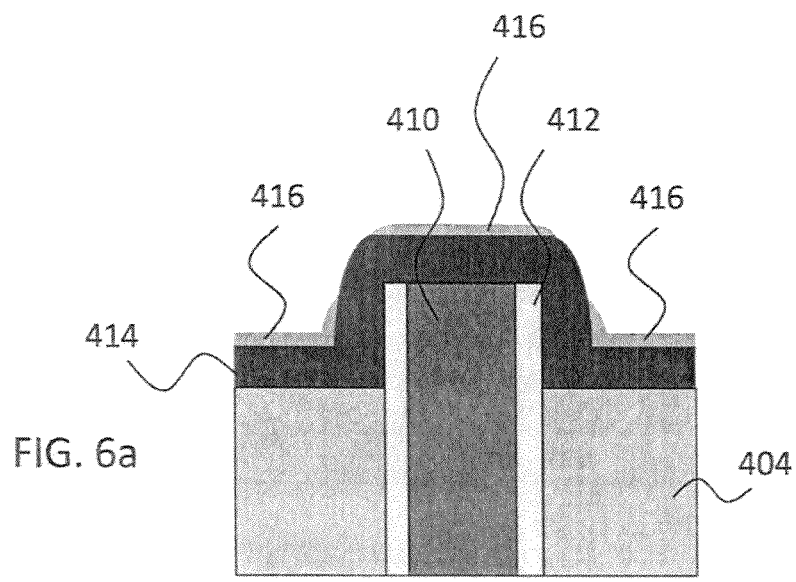
FIGS. 6a-6b illustrate cross-sectional views of FIGS. 5b-5c according to another embodiment.
Figure 6B:
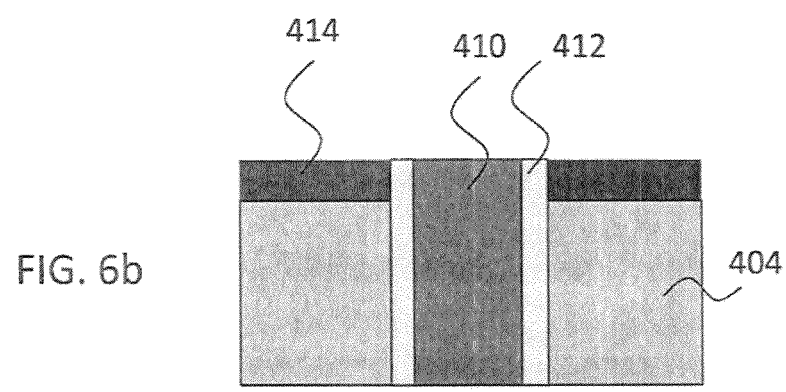

FIGS. 6a-6b are cross-sectional views of alternative embodiments of FIGS. 5b-5c. As discussed above, the second insulating layer 416 can be conformally coated over the first insulating layer 414. In FIG. 6a, the second insulating layer 416 is non-conformally coated over the first insulating layer 414. As shown, certain areas of the first insulating layer 414 about the conductive via 410 are not covered by the second insulating layer 416. Regardless of the conformity of the second insulating layer 416 with respect to the first insulating layer 414, during the CMP process a substantially planar surface can be achieved as shown in FIG. 6b for the same reasons as discussed above.

In one embodiment, a method of manufacturing a semiconductor device includes providing a semiconductor wafer, forming a conductive via into the semiconductor wafer with a portion of the conductive via extending above a surface of the semiconductor wafer, forming a plurality of insulating layers over the surface of the semiconductor wafer and the conductive via, and removing a portion of the plurality of insulating layers to expose the conductive via.

In one embodiment, the above forming step includes forming a first insulating layer over the surface of the semiconductor wafer and the conductive via, followed by forming a second insulating layer over the first insulating layer, the second insulating layer having a different material composition than the first insulating layer.

In one embodiment, the above removing step includes removing a portion of the second insulating layer, followed by removing a portion of the first insulating layer, the two removing steps capable of exposing the conductive via.

Like above, the first insulating layer includes silicon nitride while the second insulating layer includes at least one of silicon oxide, silicon dioxide, silicon oxynitride and silicon carbon nitride. In an alternative embodiment, the first insulating layer includes at least one of silicon oxide and silicon dioxide, while the second insulating layer includes at least one of silicon nitride, silicon oxynitride and silicon carbon nitride.

The thickness of the second insulating layer is in the range of from about 0.5 micron to about 5 microns. In one example, the second insulating layer can be conformally formed over the first insulating layer. In another example, the second insulating layer can be non-conformally formed over the first insulating layer.

In one embodiment, a method of making a semiconductor device includes the processing steps similar to those above: (a) providing a semiconductor wafer; (b) forming a conductive via into the semiconductor wafer; (c) removing a portion of the semiconductor wafer so the conductive via extends above a surface of the semiconductor wafer; (d) forming a first insulating layer over the surface of the semiconductor wafer and the conductive via, the first insulating layer being silicon nitride; (e) forming a second insulating layer over the first insulating layer, the second insulating layer being at least one of silicon oxide, silicon dioxide, silicon oxynitride and silicon carbon nitride; and (f) removing a portion of the second insulating layer and a portion of the first insulating layer to expose the conductive via.

In one embodiment, the forming step (e) includes conformally forming the second insulating layer over the first insulating layer. In another embodiment, the forming step (e) includes non-conformally forming the second insulating layer over the first insulating layer. In yet another embodiment, the removing step (f) includes complete removal of the second insulating layer.

In some embodiments, the thickness of the second insulating layer is in the range of from about 0.5 micron to about 5 microns Although the current description has been described in detail with reference to several embodiments, additional variations and modifications exist within the scope and spirit of the disclosure.

What is claimed is:

1. A method of making a semiconductor device, comprising:
   providing a semiconductor wafer;
   forming a conductive via into the semiconductor wafer;
   removing a portion of the semiconductor wafer so the conductive via extends above a surface of the semiconductor wafer;
   forming a first insulating layer including a first material composition contacting the surface of the semiconductor wafer and the conductive via;
   forming a second insulating layer including a second material composition over the first insulating layer; and
   removing a portion of the second insulating layer and a portion of the first insulating layer to make the conductive via and first insulating layer substantially coplanar across a width of the semiconductor wafer while detecting a difference in a property of the first material composition and second material composition using optical detection or motor current detection.

2. The method of claim 1, further including completely removing the second insulating layer.

3. The method of claim 1, wherein the first insulating layer includes silicon nitride and the second insulating layer includes at least one of silicon oxide, silicon dioxide, silicon oxynitride and silicon carbon nitride.

4. The method of claim 1, wherein the first insulating layer includes at least one of silicon oxide and silicon dioxide, and the second insulating layer includes at least one of silicon nitride, silicon oxynitride and silicon carbon nitride.

5. A method of making a semiconductor device, comprising:
   providing a semiconductor wafer;
   forming a conductive via into the semiconductor wafer with a portion of the conductive via extending above the semiconductor wafer;
   forming a first insulating layer including a first material composition over the semiconductor wafer and the conductive via;
   forming a second insulating layer including a second material composition over the first insulating layer; and
   removing a portion of the second insulating layer and a portion of the first insulating layer to expose the conductive via while detecting a difference in an optical or material property of the first material composition and second material composition.

6. The method of claim 5, further including completely removing the second insulating layer.

7. The method of claim 5, wherein the first insulating layer includes silicon nitride and the second insulating layer includes at least one of silicon oxide, silicon dioxide, silicon oxynitride and silicon carbon nitride.

8. The method of claim 5, wherein the first insulating layer includes at least one of silicon oxide and silicon dioxide, and the second insulating layer includes at least one of silicon nitride, silicon oxynitride and silicon carbon nitride.

9. The method of claim 5, wherein detecting the difference between the first material composition and second material composition is via optical detection.

10. The method of claim 5, wherein detecting the difference between the first material composition and second material composition is via motor current detection.

11. A method of making a semiconductor device, comprising:
providing a semiconductor wafer;
forming a first insulating layer including a first material composition over the semiconductor wafer;
forming a second insulating layer including a second material composition over the first insulating layer; and
removing a portion of the second insulating layer and a portion of the first insulating layer while detecting a difference in an optical or material property of the first material composition and second material composition.

12. The method of claim 11, further including completely removing the second insulating layer.

13. The method of claim 11, wherein the first insulating layer includes silicon nitride and the second insulating layer includes at least one of silicon oxide, silicon dioxide, silicon oxynitride and silicon carbon nitride.

14. The method of claim 11, wherein the first insulating layer includes at least one of silicon oxide and silicon dioxide, and the second insulating layer includes at least one of silicon nitride, silicon oxynitride and silicon carbon nitride.

15. The method of claim 11, wherein detecting the difference between the first material composition and second material composition is via optical detection.

16. The method of claim 11, wherein detecting the difference between the first material composition and second material composition is via motor current detection.

17. A method of making a semiconductor device, comprising:
providing a substrate including a first insulating layer and second insulating layer formed over the substrate; and
removing a portion of the second insulating layer and a portion of the first insulating layer while detecting a difference in an optical or material property of the first insulating layer and second insulating layer.

18. The method of claim 17, further including completely removing the second insulating layer.

19. The method of claim 17, wherein the first insulating layer includes silicon nitride and the second insulating layer includes at least one of silicon oxide, silicon dioxide, silicon oxynitride and silicon carbon nitride.

20. The method of claim 17, wherein the first insulating layer includes at least one of silicon oxide and silicon dioxide, and the second insulating layer includes at least one of silicon nitride, silicon oxynitride and silicon carbon nitride.

21. The method of claim 17, wherein detecting the difference between the first insulating layer and second insulating layer is via optical detection.

22. The method of claim 17, wherein detecting the difference between the first insulating layer and second insulating layer is via motor current detection.

* * * * *